(12) United States Patent
Kim et al.

(10) Patent No.: US 8,138,003 B2
(45) Date of Patent: Mar. 20, 2012

(54) METHOD OF MANUFACTURING NITRIDE SEMICONDUCTOR SUBSTRATES HAVING A BASE SUBSTRATE WITH PARALLEL TRENCHES

(75) Inventors: Doo-Soo Kim, Seongbuk-gu (KR); Ho-Jun Lee, Jung-gu (KR); Yong-Jin Kim, Gum-si (KR); Dong-Kun Lee, Gum-si (KR)

(73) Assignee: Siltron, Inc., Gumi (KR)

( * ) Notice: Subject to any disclaimer, the term of this patent is extended or adjusted under 35 U.S.C. 154(b) by 0 days.

(21) Appl. No.: 13/031,425

(22) Filed: Feb. 21, 2011

(65) Prior Publication Data

US 2011/0143525 A1   Jun. 16, 2011

Related U.S. Application Data

(62) Division of application No. 12/002,338, filed on Dec. 14, 2007, now Pat. No. 7,915,698.

(30) Foreign Application Priority Data

Dec. 18, 2006 (KR) .................. 10-2006-0129128

(51) Int. Cl.
*H01L 21/00* (2006.01)

(52) U.S. Cl. ........... 438/42; 257/E21.112; 257/E21.127; 438/47

(58) Field of Classification Search ........... 257/E21.112, 257/E21.127; 438/42, 47
See application file for complete search history.

(56) References Cited

U.S. PATENT DOCUMENTS

| 6,015,979 A | 1/2000 | Sugiura et al. |
| 6,106,613 A | 8/2000 | Sato et al. |
| 7,229,499 B2 | 6/2007 | Ishida |

FOREIGN PATENT DOCUMENTS

| JP | 10-321535 | 12/1998 |
| JP | 2005-298245 | 10/2005 |
| KR | 2000-0066759 | 11/2000 |
| KR | 10-0519326 | 9/2005 |
| KR | 10-2006-0030636 | 4/2006 |

*Primary Examiner* — Howard Weiss
(74) *Attorney, Agent, or Firm* — Greer, Burns & Crain, Ltd.

(57) ABSTRACT

The present invention relates to a nitride semiconductor substrate such as gallium nitride substrate and a method for manufacturing the same. The present invention forms a plurality of trenches on a lower surface of a base substrate that are configured to absorb or reduce stresses applied larger when growing a nitride semiconductor film on the base substrate from a central portion of the base substrate towards a peripheral portion. That is, the present invention forms the trenches on the lower surface of the base substrate such that pitches get smaller or widths or depths get larger from the central portion of the base substrate towards the peripheral portion.

27 Claims, 3 Drawing Sheets

(a)  (b)  (c)

(a)

(b)

(c)

(d)

METHOD OF MANUFACTURING NITRIDE
SEMICONDUCTOR SUBSTRATES HAVING A
BASE SUBSTRATE WITH PARALLEL
TRENCHES

This application is a Divisional of application Ser. No. 12/002,338, filed Dec. 14, 2007, now U.S. Pat. No. 7,915,698.

BACKGROUND OF THE INVENTION

1. Field of the Invention

The present invention relates to a nitride semiconductor substrate obtained by growing a nitride semiconductor film such as gallium nitride (GaN) film on a base substrate, and to a method for manufacturing the same.

2. Description of the Related Art

GaN is a nitride semiconductor having Wurzite structure, and has a direct transition bandgap of 3.4 eV corresponding to the blue wavelength range of visible rays at room temperature, forms a solid solution with InN and AlN to control a bandgap energy, and exhibits a characteristic of a direct transition semiconductor over the entire composition range of the solid solution. Thus, GaN is widely used as a material for a light emitting device, in particular a blue light emitting device.

Generally, a GaN film is formed on a base substrate made of sapphire ($Al_2O_3$), silicon carbide (SiC) or silicon (Si) by MOCVD (Metal Organic Chemical Vapor Deposition) or HVPE (Hydride Vapor Phase Epitaxy) method. However, the base substrate and the GaN film have different lattice constants and thermal expansion coefficients, which makes it difficult to grow epitaxially the GaN film on the base substrate. This difficulty occurs to a nitride semiconductor including AlN, InN, GaInN, AlGaN and GaAlInN in the same way as GaN.

To overcome the difficulty, for reduction of lattice strain, a method is suggested to form a buffer layer with similar lattice constant on a base substrate at a relatively low temperature and grow a GaN film on the buffer layer.

However, disadvantageously this method uses a high cost base substrate and an additional growth apparatus to form the buffer layer. And, the method grows epitaxially the GaN film, but a dislocation density in the GaN film is still high. Thus, there is limitation in application to a laser diode or a light-emitting diode.

In the case of a sapphire base substrate, it is easy to grow a GaN film on the sapphire base substrate in the level of a current technique, however, to use the GaN film as a substrate of another device, the sapphire base substrate should be separated from the GaN film-grown substrate. That is, after the GaN film is grown on the sapphire base substrate, laser beams are illuminated on the sapphire base substrate, and the sapphire base substrate is separated from the GaN film by thermal decomposition. However, it requires much time to separate the sapphire base substrate and a separation yield is low.

To solve the above-mentioned problem, attempts have been made to grow a GaN film on an inexpensive silicon base substrate that is low cost and separate the silicon base substrate from the GaN film, thereby obtaining a GaN substrate. However, it is not easy to grow the GaN film on the silicon base substrate so far, and the silicon base substrate is often etched during GaN film growth. Further, although the GaN film is grown on the silicon substrate, warpage or cracks may occur to the base substrate due to differences in thermal expansion coefficient and lattice constant.

Meanwhile, Korean Patent No. 519326 suggests a technique for forming a plurality of grooves on a lower surface of a sapphire base substrate at a regular interval in a predetermined crystal orientation and forming a GaN layer on an upper surface of the sapphire base substrate to reduce minimum stress required to remove the sapphire base substrate after growing bulk gallium nitride, thereby reducing microcracks which may occur to the bulk gallium nitride and improving a crystal characteristic of the bulk gallium nitride. However, this patent uses the sapphire substrate as a base substrate for growing GaN, and thus requires a considerable time to separate the sapphire base substrate and has low separation yield. And, this patent forms the grooves on the lower surface of the sapphire base substrate to reduce stresses applied when separating the base substrate, however the inventors of the present invention ascertain that the grooves formed at a regular interval are ineffective in preventing warpage or cracks of the substrate due to difference in thermal expansion coefficient when growing the GaN film.

SUMMARY OF THE INVENTION

Therefore, the present invention is designed to solve the above-mentioned problems of the prior arts, and therefore it is an object of the present invention to provide a nitride semiconductor substrate, in which a nitride semiconductor film is grown on a base substrate without warpage or cracks, and to provide a method for manufacturing the same and a nitride semiconductor substrate manufactured thereby.

It is another object of the present invention to provide a method for manufacturing a nitride semiconductor substrate, in which it does not require a long time to separate a base substrate and a separation yield is high, and to provide a nitride semiconductor substrate manufactured thereby.

To achieve the above-mentioned objects, the present invention forms a plurality of trenches on a lower surface of a base substrate, and in particular, the present invention forms the trenches configured to absorb or reduce stresses applied larger towards a peripheral portion of the base substrate when growing a nitride semiconductor film on the base substrate. In other words, the present invention forms a plurality of the trenches such that pitches of the trenches formed on the lower surface of the base substrate get smaller from a central portion of the base substrate towards the peripheral portion, widths of the trenches get larger from a central portion of the base substrate towards the peripheral portion, or depths of the trenches get larger from a central portion of the base substrate towards the peripheral portion.

According to an aspect of the present invention, a nitride semiconductor substrate comprises a base substrate; and a nitride semiconductor film grown on a surface of the base substrate, wherein the base substrate has a lower surface having a plurality of first trenches formed parallel to each other in a first direction, and pitches of the first trenches get smaller from a central portion of the base substrate towards a peripheral portion.

According to another embodiment of the present invention, a nitride semiconductor substrate comprises a base substrate; and a nitride semiconductor film grown on a surface of the base substrate, wherein the base substrate has a lower surface having a plurality of first trenches formed parallel to each other in a first direction, and widths of the first trenches get larger from a central portion of the base substrate towards a peripheral portion.

According to another embodiment of the present invention, a nitride semiconductor substrate comprises a base substrate; and a nitride semiconductor film grown on a surface of the base substrate, wherein the base substrate has a lower surface having a plurality of first trenches formed parallel to each other in a first direction, and widths of the first trenches get larger from a central portion of the base substrate towards a peripheral portion.

In the nitride semiconductor substrate according to each of the above embodiments, the lower surface of the base substrate further has a plurality of second trenches formed parallel to each other in a second direction intersecting the first direction, and preferably pitches of the second trenches get smaller or widths or depths of the second trenches get larger from the central portion of the base substrate towards the peripheral portion in the same way as the first trenches.

And, preferably the base substrate is made of silicon.

According to another aspect of the present invention, a method for manufacturing a nitride semiconductor substrate comprises forming a plurality of first trenches on a surface of a base substrate parallel to each other in a first direction; and forming a nitride semiconductor film on a surface of the base substrate opposite to the first trench formation surface, wherein pitches of the first trenches get smaller from a central portion of the base substrate towards a peripheral portion.

According to another embodiment of the present invention, a method for manufacturing a nitride semiconductor substrate comprises forming a plurality of first trenches on a surface of a base substrate parallel to each other in a first direction; and forming a nitride semiconductor film on a surface of the base substrate opposite to the first trench formation surface, wherein widths of the first trenches get larger from a central portion of the base substrate towards a peripheral portion.

According to another embodiment of the present invention, a method for manufacturing a nitride semiconductor substrate comprises forming a plurality of first trenches on a surface of a base substrate parallel to each other in a first direction; and forming a nitride semiconductor film on a surface of the base substrate opposite to the first trench formation surface, wherein depths of the first trenches get larger from a central portion of the base substrate towards a peripheral portion.

The method for manufacturing a nitride semiconductor substrate according to each of the above embodiments may further comprise forming a plurality of second trenches on the surface of the base substrate parallel to each other in a second direction intersecting the first direction, and preferably pitches of the second trenches get smaller or widths or depths of the second trenches get larger from the central portion of the base substrate towards the peripheral portion in the same way as the first trenches.

Here, the first trenches and/or the second trenches may be formed using a sawing wheel or photolithography.

And, the nitride semiconductor film may be formed using MOCVD or HYPE.

The method for manufacturing a nitride semiconductor substrate of the present invention may further comprise removing the base substrate after forming the nitride semiconductor film, at this time, in the case that the base substrate is made of silicon, the base substrate may be removed using wet etching.

As such, the present invention forms the trenches on the lower surface of the base substrate, and in particular, the present invention forms the trenches such that pitches of the trenches get smaller or the widths or depths of the trenches get larger from the central portion of the base substrate towards the peripheral portion, thereby sufficiently absorbing or reducing stresses applied larger from the central portion of the base substrate towards the peripheral portion. Therefore, the present invention can obtain a high quality nitride semiconductor substrate free of warpage or cracks in spite of use of a silicon base substrate that is known as hard to form a nitride semiconductor film thereon.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. In the case that the following description shows a layer exists on another layer, this may be interpreted that the layer may exist directly on another layer or a third layer may be interposed therebetween.

Figure 1:
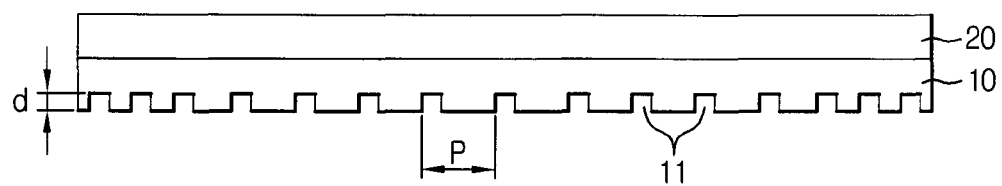
FIG. 1 is a cross-sectional view illustrating a GaN substrate manufactured according to an embodiment of the present invention.
Figure 2:
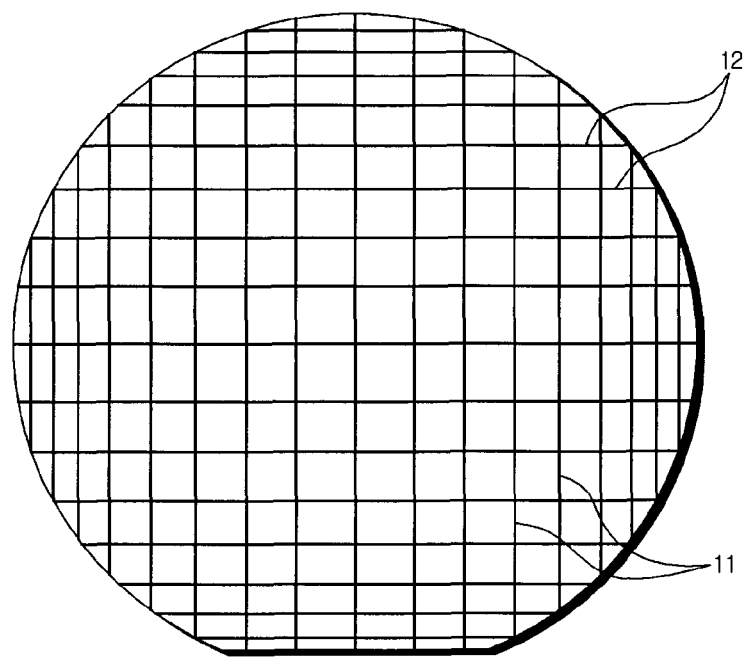
FIG. 2 is a bottom view illustrating the GaN substrate of FIG. 1.

FIG. 1 is a cross-sectional view illustrating a gallium nitride (GaN) substrate manufactured according to an embodiment of the present invention. FIG. 2 is a bottom view illustrating the GaN substrate of FIG. 1. Referring to FIGS. 1 and 2, the GaN substrate according to an embodiment of the present invention comprises a base substrate 10 and a GaN film 20 formed on the base substrate 10.

In this embodiment, the base substrate 10 uses a single crystal silicon wafer. However, the present invention is not limited in this regard, for example sapphire ($Al_2O_3$) or silicon carbide (SiC) may be used. However, use of the single crystal silicon wafer is easy and convenient to remove the base substrate by wet etching.

A plurality of trenches 11 and 12 are formed on a surface of the base substrate 10 opposite to the GaN film formation surface. Here, as shown in FIG. 2, the trenches 11 and 12 include first trenches 11 and second trenches 12 intersecting the first trenches 11. And, pitches (P) of the first and second trenches 11 and 12 get smaller from a central portion of the base substrate 10 towards a peripheral portion of the base substrate 10. That is, the trenches 11 and 12 get denser towards the peripheral portion of the base substrate 10. As described later, when the GaN 20 film is grown, stresses are applied larger towards the peripheral portion of the base substrate 10, and thus the peripheral portion of the base substrate 10 is more susceptible to warpage or cracks. Accordingly, the trenches 11 and 12 are configured to absorb the larger stresses applied to the peripheral portion.

Specifically, the pitches (P) of the first and second trenches 11 and 12 may be adjusted within the range of 0.01 cm to 1.0 cm. That is, the pitches (P) of the trenches 11 and 12 formed on the central portion of the base substrate 10 may be 1.0 cm and the pitches (P) of the trenches 11 and 12 formed on the peripheral portion of the base substrate 10 may be 0.01 cm. And, the pitches (P) may be grouped, be equal in each group, and adjusted gradually by groups. Alternatively, the pitches (P) may be each adjusted independently.

And, widths of the trenches 11 and 12 may be adjusted properly within the range of 1 μm to 1 mm. Further, depths (d) of the trenches 11 and 12 may be adjusted properly within the range of 5 μm to 900 μm when thickness of the base substrate 10 is 50 μm to 1 mm, which may be different depending on the thickness of the base substrate 10.

Meanwhile, specific values of the exemplary pitches, widths and depths of the trenches 11 and 12 are defined only for exemplification. That is, the dimension of stresses applied to the central and peripheral portions of the base substrate 10 and difference range in stress dimension therebetween may be different depending on a method for forming the GaN film 20 to be described later, process conditions of the method or thickness of the GaN film 20, and besides kind of material used as the base substrate 10 and size of the base substrate 10. Therefore, the pitches, widths and depths of the trenches 11 and 12 may be adjusted properly to absorb or reduce the stresses applied to the central and peripheral portions of the base substrate 10 and the stress difference therebetween, and they are not limited to the exemplary range.

And, although this embodiment shows that the pitches (P) of the trenches 11 and 12 are adjusted while the widths and depths of the trenches 11 and 12 are fixed at specific values, while pitches (P) of the trenches 11 and 12 may be fixed and the widths or depths may be adjusted, as described below. Alternatively, an arbitrary combination among the pitches, widths and depths may be adjusted.

Figure 3:
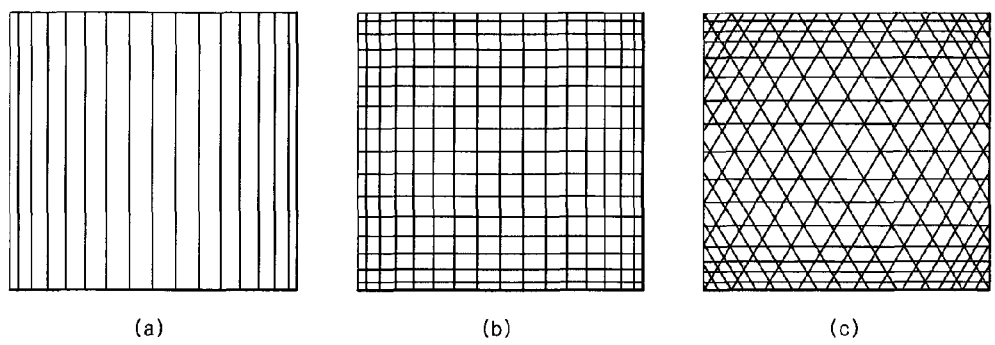
FIG. 3 is a bottom view illustrating examples of trenches formed on a lower surface of a base substrate according to an embodiment of the present invention.

Further, although FIGS. 1 and 2 show that the trenches 11 and 12 formed on the lower surface of the base substrate 10 intersect at right angle, the present invention is not limited in this regard. And, as shown in FIG. 3, trenches of various shapes may be formed on the lower surface of the base substrate 10. That is, as shown in FIG. 3(a), trenches may be formed in a stripe shape only in one direction such that pitches get smaller from the central portion towards the peripheral portion. And, as shown in FIG. 3(c), trenches may intersect in three directions.

The GaN film 20 is formed on a surface of the base substrate 10 opposite to the lower surface having the trenches 11 and 12. By a proper forming method to be described later, the GaN film 20 may have a proper thickness according to purpose of use of a GaN substrate, for example 10 to 500 μm. And, as the thickness of the GaN film 20 changes, the widths and pitches of the trenches 11 and 12 of the base substrate 10 may change. As the stresses change depending on the thickness of the GaN film 20, the widths and pitches of the trenches 11 and 12 should be adjusted.

Meanwhile, the principle of the present invention is applied to a nitride semiconductor including AlN, InN, GaInN, AlGaN and GaAlInN in the same way as a pure GaN. Therefore, the GaN film 20 may be replaced by such a nitride semiconductor, and besides may be multilayered such that a plurality of layers including a nitride semiconductor film are stacked.

Figure 4:
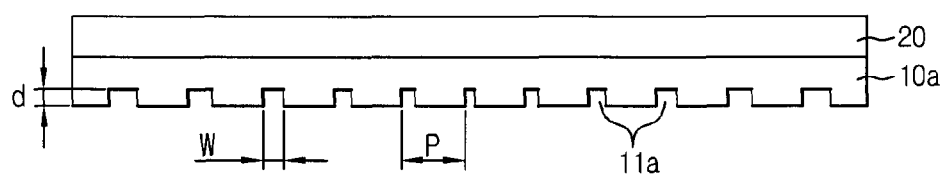
FIG. 4 is a cross-sectional view illustrating a GaN substrate manufactured according to another embodiment of the present invention.

FIG. 4 is a cross-sectional view illustrating a GaN substrate manufactured according to another embodiment of the present invention. Hereinafter, the GaN substrate of this embodiment is described focusing on a distinction from the GaN substrate of the above embodiment.

The distinction between the GaN substrate of this embodiment and the GaN substrate of the above embodiment is a structure of trenches. In other words, in this embodiment, trenches 11a formed on a lower surface of a base substrate 10a have the same pitches (P) and depths (d), and widths (W) of the trenches 11a get larger from a central portion of the base substrate 10a towards a peripheral portion. This trench structure allows to absorb or reduce stresses applied larger towards the peripheral portion of the base substrate 10a, thereby preventing warpage or cracks from occurring to the substrate. Specifically, the widths (W) of the trenches 11a may be adjusted in the range of 1 μm to 1 mm. However, the specific values are defined only for exemplification, and as described above, they may be different depending on a method for forming the GaN film 20 to be described later, process conditions of the method or thickness of the GaN film 20, kind of material used as the base substrate 10a and size of the base substrate 10a.

Figure 5:
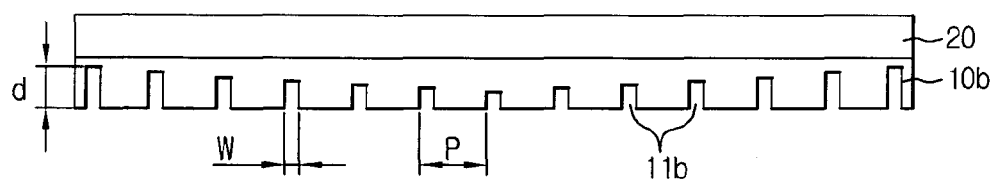
FIG. 5 is a cross-sectional view illustrating a GaN substrate manufactured according to another embodiment of the present invention.

FIG. 5 is a cross-sectional view illustrating a GaN substrate manufactured according to another embodiment of the present invention. Hereinafter, the GaN substrate of this embodiment is described focusing on a distinction from the GaN substrates of the above embodiments.

The distinction between the GaN substrate of this embodiment and the GaN substrates of the above embodiments is a structure of trenches. In other words, in this embodiment, the trenches 11b formed on a lower surface of a base substrate 10b have the same pitches (P) and widths (W), and depths (d) of the trenches 11b get larger from a central portion of the base substrate 10b towards a peripheral portion. This trench structure allows to absorb or reduce stresses applied larger towards the peripheral portion of the base substrate 10b, thereby preventing warpage or cracks from occurring to the substrate. Specifically, the depths (d) of the trenches 11b may be adjusted properly in the range of 5 μm to 900 μm when thickness of the base substrate 10b is 50 μm to 1 mm, which may be different depending on the thickness of the base substrate 10b. However, the specific values are defined only for exemplification, and as described above, they may be different depending on a method for forming the GaN film 20 to be described later, process conditions of the method or thickness of the GaN film 20 and size of the base substrate 10b, a silicon wafer.

And, in the same way as the embodiment of FIG. 1, the embodiments of FIGS. 4 and 5 may have trenches of various shapes and further have an arbitrary combination of the shapes shown in FIGS. 4 and 5. Therefore, the nitride semiconductor substrate of the present invention is configured to absorb or reduce stresses applied larger to the peripheral portion of the base substrate by adjusting the pitches, widths or depths of the trenches formed on the lower surface of the base substrate.

Subsequently, a method for manufacturing the nitride semiconductor substrate according to the present invention is described in detail. Although this embodiment shows a single crystal silicon wafer as the base substrate 10 and the GaN film 20 as a nitride semiconductor film, the present invention is not limited in this regard.

First, a silicon wafer with (111) surface orientation is prepared as the base substrate 10. A plurality of trenches 11, 12, 11a and 11b of the above-mentioned structure and shape are formed on the lower surface of the base substrate 10. The trenches 11, 12, 11a and 11b may be formed by a sawing wheel used to saw a wafer or by photolithography used in a semiconductor fabrication process. In the case of the sawing wheel, thickness of the sawing wheel defines widths of the trenches 11, 12, 11a and 11b. The widths of the trenches 11, 12, 11a and 11b may be adjusted by selectively using a sawing wheel having thickness of 0.01 to 1 mm. Depths and pitches of the trenches 11, 12, 11a and 11b may be adjusted by a sawing depth of the sawing wheel and a relative location between the sawing wheel and the base substrate 10, respectively. Meanwhile, in the case of the photolithography, an etching mask (a photoresist pattern or a silicon oxide pattern) of desired structure and shape is formed on the lower surface of the base substrate 10, and the base substrate 10 is etched using a proper etching gas or liquid. At this time, the photolithography may simply adjust the pitches or widths of the trenches according to pattern of the etching mask, and allows finer patterns than the sawing wheel according to the current semiconductor fabrication technique. However, the trench structure shown in FIG. 5 is formed by repetition of photolithograph process or etching process, and thus requires more costs.

Subsequently, the GaN film 20 is formed on a surface of the base substrate 10 having a desired trench structure. The GaN film 20 may be formed up to a desired thickness by a well-known method such as MOCVD or HYPE method. Specifically, Ga source gas and N source gas are simultaneously flowed into a reactor at 1000 to 1100° C. to grow a GaN film. For example, the GaN film is grown with thickness 10 to 500 μm by HYPE method. Here, the Ga source gas may use $GaCl_3$ gas, or HCl gas as a carrier gas is flowed into Ga metal, and the N source gas may use $NH_3$ gas. As the trenches are formed on the lower surface of the base substrate 10 to absorb or reduce the stresses applied larger from the central portion towards the peripheral portion of the base substrate 10, faults such as cracks or peeling or warpage does not occur to the grown GaN film 20 or the base substrate 10, and thus a high quality GaN film is obtained.

And, a proper buffer layer may be formed before forming the GaN film 20, and if necessary, another film may be formed on the GaN film 20.

A GaN substrate according to the present invention is obtained through the above-mentioned process, and to use the GaN substrate as a substrate of a device, the base substrate 10 may be separated or removed. In this embodiment, the GaN substrate uses the base substrate 10 made of silicon, and the base substrate 10 may be simply removed by a wet etching method. That is, removal of the silicon base substrate 10 is made such that a nitric acid solution ($HNO_3$, 70%) and a hydrofluoric acid solution (HF, 5%) are properly mixed in the range of a mixing ratio of 0.1 to 10 to produce an etching solution, and the GaN substrate shown in FIG. 1, 4 or 5 is dipped in the etching solution, so that the base substrate 10 is removed with an etching ratio of 1 to 100 μm/min. Subsequently, an acetic acid solution is added to the etching solution with 10% or less, so that the remaining silicon is removed.

Meanwhile, in the case that the base substrate 10 is made of sapphire or silicon carbide, the base substrate 10 may be removed by another well-known method such as thermal decomposition using laser or diamond grinding.

Subsequently, the effect of the present invention is described through concrete experimental examples.

Figure 6:
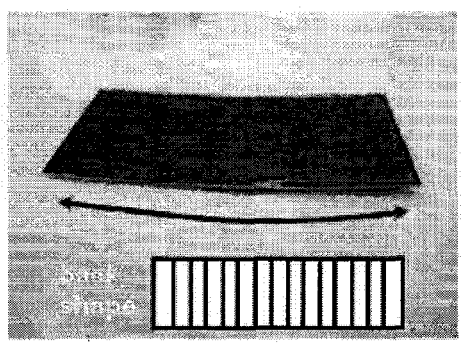
FIG. 6 shows photographs of cracks of a GaN film or warpage of a substrate, in which trenches of different shapes are formed on a lower surface of the base substrate and the GaN film is formed on a surface of the base substrate according to examples of the present invention and comparison examples.
Figure 6:
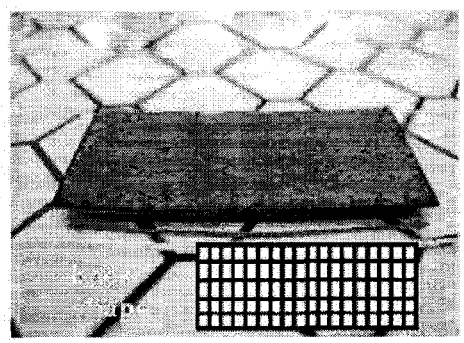
Figure 6:
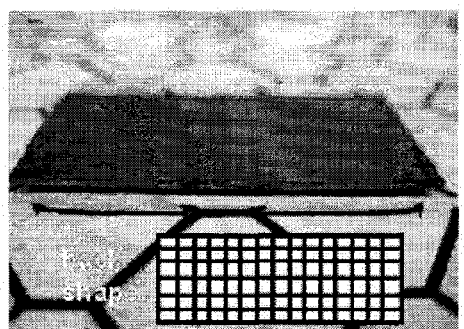
Figure 6:
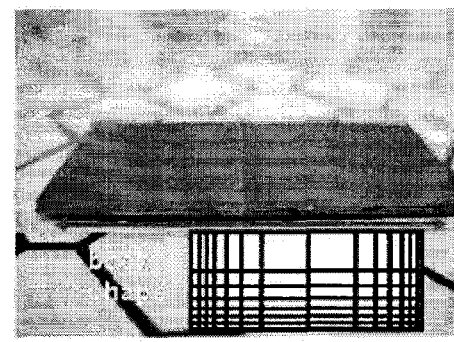

FIG. 6 shows photographs of faults such as cracks of a GaN film or warpage of a substrate, in which trenches of different shapes are formed on a lower surface of the base substrate and the GaN film is formed on the other surface of the base substrate according to examples of the present invention and comparison examples. Each sample shown in FIG. 6(a) to (d) are prepared such that a 6-inch silicon wafer (thickness: 670 μm) is divided into six rectangular areas, trenches of the same structure are formed on the six areas, the six areas are cut into each other, and a GaN film (thickness: 60 μm) is grown on a surface of each area opposite to the trench structure forming surface. In each sample, the trenches have the same depths of 150 on and the same widths of 500 μm.

Referring to FIG. 6(a), trenches are formed with regular pitches (1 mm) in one direction, and it is viewed with naked eye that the substrate has warpage and the GaN film has cracks and peeling caused by the cracks and warpage.

Referring to FIG. 6(b), trenches are formed on the lower surface of the base substrate in mutually perpendicular directions with regular pitches. The horizontal pitches are different from the vertical pitches (horizontal pitches: 0.5 mm, vertical pitches: 1 mm), and it is viewed that the substrate has warpage and the GaN film has cracks.

Referring to FIG. 6(c), trenches are formed on the lower surface of the base substrate in mutually perpendicular directions with regular pitches. The horizontal pitches are equal to the vertical pitches (pitches: 0.5 mm), and as compared with FIG. 6(b), warpage prevention effect is improved, but it is viewed that the substrate has warpage and the GaN film has cracks at the peripheral portion.

Referring to FIG. 6(d), trenches are formed on the lower surface of the base substrate in mutually perpendicular directions. According to the present invention, the pitches get smaller from the central portion towards the peripheral portion by four pitch gradation of 10 mm, 4 mm, 2 mm and 1 mm, and it is viewed that the substrate is free of warpage and cracks of the GaN film.

It should be understood that the detailed description and specific examples, while indicating preferred embodiments of the invention, are given by way of illustration only, since various changes and modifications within the spirit and scope of the invention will become apparent to those skilled in the art from this detailed description.

APPLICABILITY TO THE INDUSTRY

As described above, the present invention forms the trenches on the lower surface of the base substrate before growing the nitride semiconductor film such as to reduce the pitches or increase the widths or depths from the central portion of the base substrate towards the peripheral portion, thereby preventing warpage of the substrate and cracks of the GaN film caused by thermal distortion occurring when growing the nitride semiconductor film.

Accordingly, the present invention can obtain a high quality nitride semiconductor substrate free of warpage or cracks in spite of use of a silicon base substrate that is known as hard to form a nitride semiconductor film thereon.

And, in the case that a base substrate is made of silicon, the base substrate is simply removed by a chemical method such as wet etching to obtain a nitride semiconductor substrate with short time, low cost, and high yield.

What is claimed is:

1. A method for manufacturing a nitride semiconductor substrate, comprising:
   forming a plurality of first trenches on a lower surface of a base substrate parallel to each other in a first direction; and
   forming a nitride semiconductor film on a top surface of the base substrate opposite to the first trench formation surface,
   wherein pitches of the first trenches change towards a peripheral portion of the base substrate in a predetermined tendency.

2. The method for manufacturing a nitride semiconductor substrate according to claim 1, further comprising:
forming a plurality of second trenches on the surface of the base substrate parallel to each other in a second direction intersecting the first direction,
wherein pitches of the second trenches get smaller from the central portion of the base substrate towards the peripheral portion.

3. The method for manufacturing a nitride semiconductor substrate according to claim 2,
wherein the first and second directions intersect at right angle.

4. The method for manufacturing a nitride semiconductor substrate according to claim 1,
wherein the first trenches are formed using a sawing wheel.

5. The method for manufacturing a nitride semiconductor substrate according to claim 1,
wherein the first trenches are formed using photolithography.

6. The method for manufacturing a nitride semiconductor substrate according to claim 1,
wherein the nitride semiconductor film is formed using MOCVD (Metal Organic Chemical Vapor Deposition) or HVPE (Hydride Vapor Phase Epitaxy).

7. The method for manufacturing a nitride semiconductor substrate according to claim 1,
wherein the base substrate is made of silicon.

8. The method for manufacturing a nitride semiconductor substrate according to claim 1, further comprising:
removing the base substrate after forming the nitride semiconductor film.

9. The method for manufacturing a nitride semiconductor substrate according to claim 8,
wherein the base substrate is made of silicon and removed using wet etching.

10. A method for manufacturing a nitride semiconductor substrate, comprising:
forming a plurality of first trenches on a lower surface of a base substrate parallel to each other in a first direction; and
forming a nitride semiconductor film on a top surface of the base substrate opposite to the first trench formation surface,
wherein widths of the first trenches change towards a peripheral portion of the base substrate in a predetermined tendency.

11. The method for manufacturing a nitride semiconductor substrate according to claim 10, further comprising:
forming a plurality of second trenches on the surface of the base substrate parallel to each other in a second direction intersecting the first direction,
wherein widths of the second trenches get larger from the central portion of the base substrate towards the peripheral portion.

12. The method for manufacturing a nitride semiconductor substrate according to claim 11,
wherein the first and second directions intersect at right angle.

13. The method for manufacturing a nitride semiconductor substrate according to claim 10,
wherein the first trenches are formed using a sawing wheel.

14. The method for manufacturing a nitride semiconductor substrate according to claim 10,
wherein the first trenches are formed using photolithography.

15. The method for manufacturing a nitride semiconductor substrate according to claim 10,
wherein the nitride semiconductor film is formed using MOCVD (Metal Organic Chemical Vapor Deposition) or HVPE (Hydride Vapor Phase Epitaxy).

16. The method for manufacturing a nitride semiconductor substrate according to claim 10,
wherein the base substrate is made of silicon.

17. The method for manufacturing a nitride semiconductor substrate according to claim 10, further comprising:
removing the base substrate after forming the nitride semiconductor film.

18. The method for manufacturing a nitride semiconductor substrate according to claim 17,
wherein the base substrate is made of silicon and removed using wet etching.

19. A method for manufacturing a nitride semiconductor substrate, comprising:
forming a plurality of first trenches on a lower surface of a base substrate parallel to each other in a first direction; and
forming a nitride semiconductor film on a top surface of the base substrate opposite to the first trench formation surface,
wherein depths of the first trenches change towards a peripheral portion of the base substrate in a predetermined tendency.

20. The method for manufacturing a nitride semiconductor substrate according to claim 19, further comprising:
forming a plurality of second trenches on the surface of the base substrate parallel to each other in a second direction intersecting the first direction,
wherein depths of the second trenches get larger from the central portion of the base substrate towards the peripheral portion.

21. The method for manufacturing a nitride semiconductor substrate according to claim 20,
wherein the first and second directions intersect at right angle.

22. The method for manufacturing a nitride semiconductor substrate according to claim 19,
wherein the first trenches are formed using a sawing wheel.

23. The method for manufacturing a nitride semiconductor substrate according to claim 19,
wherein the first trenches are formed using photolithography.

24. The method for manufacturing a nitride semiconductor substrate according to claim 19,
wherein the nitride semiconductor film is formed using MOCVD (Metal Organic Chemical Vapor Deposition) or HVPE (Hydride Vapor Phase Epitaxy).

25. The method for manufacturing a nitride semiconductor substrate according to claim 19,
wherein the base substrate is made of silicon.

26. The method for manufacturing a nitride semiconductor substrate according to claim 19, further comprising:
removing the base substrate after forming the nitride semiconductor film.

27. The method for manufacturing a nitride semiconductor substrate according to claim 26,
wherein the base substrate is made of silicon and removed using wet etching.

* * * * *